(12) United States Patent
Suzuki

(10) Patent No.: US 6,373,710 B1
(45) Date of Patent: Apr. 16, 2002

(54) ELECTRONIC DEVICE WITH COAXIAL CONNECTORS FOR HIGH-FREQUENCY CIRCUIT BOARD

(75) Inventor: Akinobu Suzuki, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/497,160

(22) Filed: Feb. 3, 2000

(30) Foreign Application Priority Data

Feb. 12, 1999 (JP) .......................................... 11-034402

(51) Int. Cl.[7] ................................................. H05K 5/00
(52) U.S. Cl. ....................... 361/752; 361/753; 361/801; 211/41.17; 439/74
(58) Field of Search ................................ 361/728, 736, 361/752, 753, 759, 801, 807; 439/74, 75; 211/41.17

(56) References Cited

FOREIGN PATENT DOCUMENTS

| JP | Hei 2-58389 | 4/1990 |
|---|---|---|
| JP | Hei 2-281433 | 11/1990 |
| JP | Hei 3-270925 | 12/1991 |
| JP | Hei 5-109452 | 4/1993 |
| JP | Hei 10-145060 | 5/1998 |

*Primary Examiner*—Jayprakash N. Gandhi
(74) *Attorney, Agent, or Firm*—Burns, Doane, Swecker & Mathis, LLP

(57) ABSTRACT

Electronic devices are provided with a high-frequency circuit board and a coaxial connector connected to external high-frequency signals to the circuit board. The lead terminal of the coaxial connector is directly soldered to a land on the circuit board to enable high-frequency signal transmission. The fixing portion, which is on one side of the circuit board and apart from the coaxial connector, has a structure such that the horizontal tension of the circuit board is relaxed. In this mounting method, repetitive tension due to differences in linear expansion coefficient does not act on the soldered portion.

3 Claims, 5 Drawing Sheets

ELECTRONIC DEVICE WITH COAXIAL CONNECTORS FOR HIGH-FREQUENCY CIRCUIT BOARD

BACKGROUND OF THE INVENTION

1. Field of the Invention

The present invention relates to electronic devices, such as microwave and photoelectronic equipment, having coaxial connectors and a high-frequency circuit board connected to the coaxial connectors.

2. Description of Related Art

FIG. 5(A) is a perspective view illustrating an electronic device having coaxial connectors and a high-frequency circuit board. FIG. 5(B) is a cross-sectional view partially illustrating the electronic device of FIG. 5(A) in a mounted state. Referring to FIGS. 5(A) and 5(B), numeral 1 indicates a circuit board on which high-frequency circuits are mounted; 2 indicates a screw for fastening the circuit board 1; 3 indicates a case for holding the circuit board 1; 4 indicates an insertion hole formed in the circuit board 1 to accept the screw 2; 5 indicates a soldering land formed on the circuit board 1; 6 indicates a coaxial connector for externally transmitting high-frequency signals; and 7 indicates a lead terminal of the coaxial connector 6 to be soldered to the land 5. Numeral 8 indicates a screw for fastening the coaxial connector. Numeral 9 indicates a threaded hole formed in the case 3 to accept the screw 2. Numeral 10 indicates a cover attached to the case 3.

In order to prevent degradation of the high-frequency signal transmitted between the circuit board 1 and the coaxial connector 6, the characteristic impedance of the land 5 is matched with that of the coaxial connector 6 by setting the dielectric constant and thickness of the material for the circuit board 1 and the dimensions of the land 5 and the lead terminal 7 to an optimum value.

In the method of mounting the electronic device, screws 2 are respectively threaded into the threaded holes 9 formed in the case 3 through the holes 4 so that the circuit board 1 is fixed to the case 3. The coaxial connectors 6 are fastened to the case 3 with screws 8. The lead terminal 7 of each coaxial connector 6 is soldered with the land 5 formed on the circuit board 5. Then, the cover 10 is fastened on the case 3. The circuit board 1 is electrically connected to the coaxial connectors 6 by soldering the lead terminals 7 with the lands 5, so that high-frequency signal transmission can be achieved.

Generally, conventional electronic devices and the mounting method thereof are embodied as described above. With this configuration, the heat generated from the electronic circuit components mounted on the circuit board 1 and changes in the air temperature outside the case 3 cause repetitive tension due to differences in linear expansion coefficient between the circuit board 1 and the case 3. This tension acts the soldering portion between the land 5 and the lead terminal 7. For instance, in most photoelectronic equipment, the soldering portion must withstand a wide temperature range of between −40° C. and +85° C. In consideration of the accessibility, processability, and cost effectiveness, a glass fabric-based epoxy resin is usually used for the circuit board 1 while an aluminum alloy is usually used for the case 3. The glass fabric-based epoxy resin has a linear expansion coefficient of $1.4 \times 10^{-5}/°$ C. The aluminum alloy has a linear expansion coefficient of $2.4 \times 10^{-5}/°$ C. The linear expansion coefficient of the case 3 is larger than that of the circuit board 1. Hence, the circuit board 1 cannot follow thermal expansion or contraction (or shrinkage) of the case 3. The tension acts the circuit board 1 so as to warp the circuit board 1, with the screw 2 at the fixing portion regarded as an origin point. Moreover, the repetitive tension due to changes in temperature distorts the soldering portion between the land 5 and the lead terminal 7, thus degrading the soldering strength. As a result, cracking of the soldering portion occurs, thus degrading the reliability of the soldering portion over a long period of time. Conventionally, an attempt is made to overcome these problems by increasing the soldering area to ensure sufficient soldering strength. The measure of increasing the soldering area is increasing the size of the soldering land 5 or the size of the lead terminal 7. However, these measures themselves cause a disadvantage that the characteristic impedance of the land 5 is mismatched with the characteristic impedance of the coaxial connector 6 so that the high-frequency characteristic is deteriorated. In another measure, the likelihood of soldering cracks is reduced by equalizing the linear expansion coefficient of the circuit board 1 to that of the case 3. However, this method remarkably increases the material costs for the circuit board 1 and the case 3. In yet another measure, the circuit board 1 is securely attached with the case 3 with an adhesive agent with low elastic coefficient is adopted to relax the repetitive tension due to temperature changes. However, this method leads to poor heat dissipation of the circuit board 1 and to an unstable ground potential to the circuit, thus degrading the high-frequency characteristics.

SUMMARY OF THE INVENTION

This invention is made to overcome the above-mentioned problems. It is an object of the present invention to provide electronic equipment wherein repetitive tension due to changes in temperature does not act on the soldered portion between the land and the lead terminal, so that the reliability of the soldering strength can be maintained for a long time. Another object of the present invention is to provide an electronic device that has good high-frequency characteristics by optimizing the characteristic impedance between the land and the coaxial connector and by stabilizing the circuit ground potential.

A further object of the present invention is to provide an electronic device that has good heat dissipation of the circuit board.

Moreover, still another object of the present invention is to provide an electronic device that can be fabricated inexpensively.

In a first aspect of the present invention, an electronic device comprises a circuit board on which electronic circuits are mounted, said circuit board having a land; a case to which said circuit board is assembled, said case having a linear expansion characteristic different from that of said circuit board; a connector connected to said case and electrically connected to an external signal, said connector having a lead terminal soldered to said land; a fixture fixing said circuit board to said case on the side of said circuit board and near said connector; and a sliding tool mounted on the other side of said circuit board and apart from said connector, and sliding said circuit board in the direction perpendicular to the thickness of said circuit board according to ambient thermal changes, with said circuit board being held in the direction of the thickness thereof.

According to this first aspect of the present invention, as the circuit board and the case thermally expand or contract due to temperature changes, the circuit board horizontally slides with respect to the case, so that the tension caused by differences in expansion or contraction (that is, in linear expansion coefficient) is relaxed. The tension does not act on the soldering portion between the land and the lead terminal so that the degradation in the soldering strength can be prevented. The long-term reliability of the soldering portion as well as the high-frequency signal characteristics can be maintained without changing the size of the land and the size of the lead terminal of the circuit board. Without consideration of the linear expansion efficient, the circuit board can be directly fastened to the case formed of aluminum alloy or copper alloy with an excellent thermal conductivity and with an excellent electrical conductivity. This feature can provide improved heat dissipation and improved high-frequency characteristics due to the stabilized circuit ground potential.

In a second aspect of the present invention, an electronic device comprises a circuit board on which electronic circuits are mounted, said circuit board having a land; a case to which said circuit board is assembled, said case having a linear expansion characteristic different from that of said circuit board; a connector connected to said case and electrically connected to an external signal, said connector having a lead terminal soldered to said land; a fixture fixing said circuit board to said case on the side of said circuit board and near said connector; a screw fastening said circuit board to said case on the other side of said circuit board and apart from said connector: and a washer inserted between the head of said screw and said circuit board and having a small surface frictional resistance.

In the electronic device according to a third aspect of the present invention, the washer is formed of a resin such as poly-4-ethylene fluoride and nylon, or of a metal coated with a resin.

In the second and third aspects of the invention, the fixing portion of the circuit board on the side of the connector is fastened to the case while the fixing portion of the circuit board positioned apart from the connector is fastened to the case with screws through washers with a small surface friction resistance. With this structure, even when the circuit board and the case expand or contract thermally, the tension caused by differences in expansion or contraction (that is, in linear expansion coefficient) is relaxed because the circuit board slides horizontally between the case and the washers. Hence, the tension does not act on the soldering portion between the land and the lead terminal and degradation of the soldering strength can be prevented. Moreover, the reliability and the high-frequency characteristics of the soldering portion can be reserved for a long time without changing the size of the circuit board or the size of the lead terminal. The circuit board can be directly fixed to the case formed of an aluminum or copper alloy with an excellent thermal conductivity and with an excellent electrical conductivity, regardless of its linear expansion coefficient. Hence, the circuit board can provide improved heat dissipation and improved high-frequency signal characteristics due to its stable circuit ground potential. Moreover, use of the inexpensive washers allows an increase in material costs to be minimized.

In a fourth aspect of the present invention, electronic device comprises a circuit board on which electronic circuits are mounted, said circuit board having a land; a case to which said circuit board is assembled, said case having a linear expansion characteristic different from that of said circuit board; a connector connected to said case and electrically connected to an external signal, said connector having a lead terminal soldered to said land; a fixture fixing said circuit board to said case on the side of said circuit board and near said connector; and a special screw fastening said circuit board to said case on the other side of said circuit board and apart from said connector, said special screw having a stepped shank of the same height as the thickness of said circuit board or slightly higher than the thickness of said circuit board.

In this fourth aspect of the invention, the fixing portion of the circuit board positioned on the connector side is fastened to the case while the fixing portion of the circuit board positioned apart from the coaxial connector is fastened to the case by means of special screws with a stepped shank of the same height as the thickness of the circuit board or slightly higher than thereof. With this structure, even when the circuit board and the case expand or contract thermally, the tension caused by differences in expansion or contraction (that is, in linear expansion coefficient) is relaxed because the circuit board slides horizontally between the case and the head of the special screws. Hence, the tension does not act on the soldering portion between the land and the lead terminal and degradation of soldering strength can prevented. The reliability of the soldering portion as well as the high-frequency signal characteristics can be reserved without changing the size of the land of the circuit board and the size of the lead terminal. The circuit board can be directly fastened to the case formed of an aluminum or copper alloy with good thermal conductivity and with good electrical conductivity, regardless of its thermal linear expansion coefficient. The improved heat dissipation and the stabilized circuit ground potential result in good high-frequency characteristics. Moreover, use of the special screws can suppress the number of components and, therefore, the material costs.

In a fifth aspect of the present invention, electronic device comprises a circuit board on which electronic circuits are mounted, said circuit board having a land; a case to which said circuit board is assembled, said case having a linear expansion characteristic different from that of said circuit board; a connector connected to said case and electrically connected to an external signal, said connector having a lead terminal soldered to said land; a fixture fixing said circuit board to said case on the side of said circuit board; and a resilient holding tool biasing said circuit board on the other side of said circuit and apart from said connector, in the direction of the thickness of said circuit board.

In this fifth aspect of the present invention, the fixing portion of the circuit board positioned on the connector side is fastened to the case while the fixing portion of the circuit board positioned apart from the connector is fixed on the case, with the circuit board biased in the thickness direction thereof by means of a resilient tool. With this structure, even when the circuit board and the case expand or contract thermally, the tension caused by differences in expansion or contraction (that is, in linear expansion coefficient) is relaxed because the circuit board slides between the case and the holding tools. The tension does not act on the soldering portion between the land and the lead terminal so that the degradation in the soldering strength can be prevented. The reliability of the soldering portion as well as that of the high-frequency signal characteristics can be maintained for a long time, without changing the size of the land of the circuit board and the size of the lead terminal. The improved heat dissipation and the stabilized circuit ground potential result in good high-frequency characteristics.

In a sixth aspect of the present invention, the holding tool is attached to the case and is formed into a thumbnail shape.

In this sixth aspect of the invention, the thumbnail shaped tools to be attached to the case are arbitrarily shaped, so that the force pressing the circuit board in the thickness direction can be arbitrarily adjusted. Hence, the factor can be reduced where unstable electrical resistance occurs between the case and the circuit board ground because of variations in the treading operation to the circuit board. As a result, the high-frequency signal characteristics can be improved.

In a seventh aspect of the present invention, the holding tool is attached to a cover fixed on the case and is formed into a thumbnail shape.

In a seventh aspect of the invention, the fixing portion of the circuit board positioned on the connector side is fastened to the case while the fixing portion of the circuit board positioned apart from the connector is fixed to the case, with the circuit board pressed down in the thickness direction by resilient thumbnail shaped tools attached to the cover. Thus, even when the circuit board and the ease expand or contract thermally, the circuit board slides horizontally between the substrate and the tools so that the tension caused by differences in expansion or contraction (that is, in linear expansion coefficient) is relaxed. Hence, the tension does not act on the soldering portion between the land and the lead terminal so that the soldering strength can be prevented from degradation. The long-term reliability of the soldering portion as well as the high-frequency characteristics can be maintained without changing the size of the land of the circuit board or the size of the lead terminal. The circuit board can be directly fixed to the case formed of an aluminum or copper alloy with good thermal conductivity and with good electrical conductivity, regardless of the line expansion coefficient. As a result, this feature can provide good heat dissipation of the circuit board and a stabilized circuit ground potential, so that good high-frequency characteristics can be obtained. Moreover, the thumbnail shaped tools attached to the cover can be flexibly shaped to arbitrarily adjust the force pressing the circuit board in the thickness direction thereof. Thus, a factor for an unstable electrical resistance between the case and the board ground potential due to variations in threading the circuit board can be reduced. The circuit board can be electrically connected to the cover via the thumbnail shaped tool in the shortest distance so that the high-frequency signal characteristics can be further improved.

BRIEF DESCRIPTION OF THE DRAWINGS

These and other objects, features, and advantages of the present invention will become more apparent upon a reading of the following detailed description and drawings,. in which.

DESCRIPTION OF THE PREFERRED EMBODIMENTS

Figure 1:
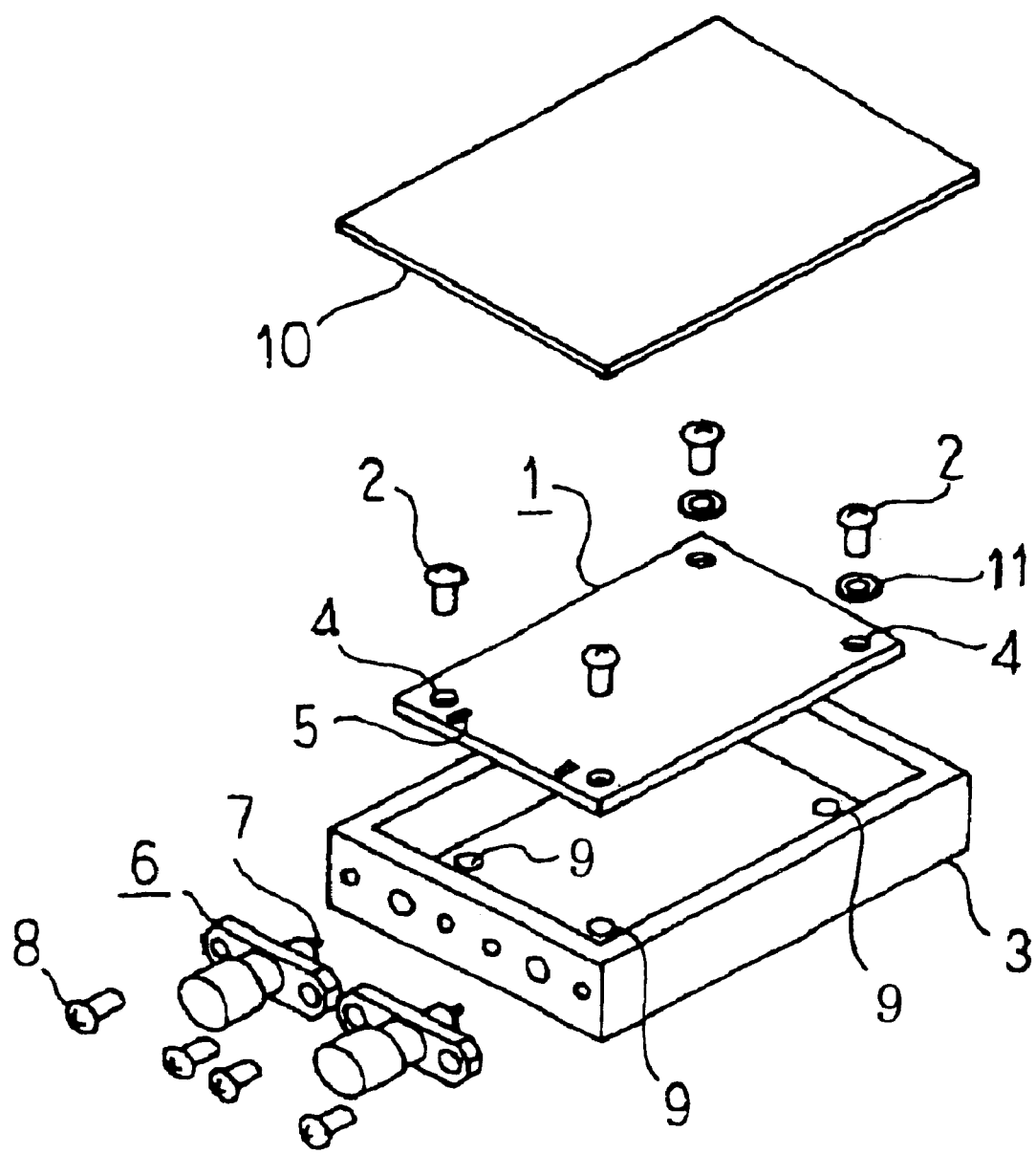
FIG. 1 is a perspective view illustrating an electronic device according to a first embodiment of the present invention.
Figure 5A:
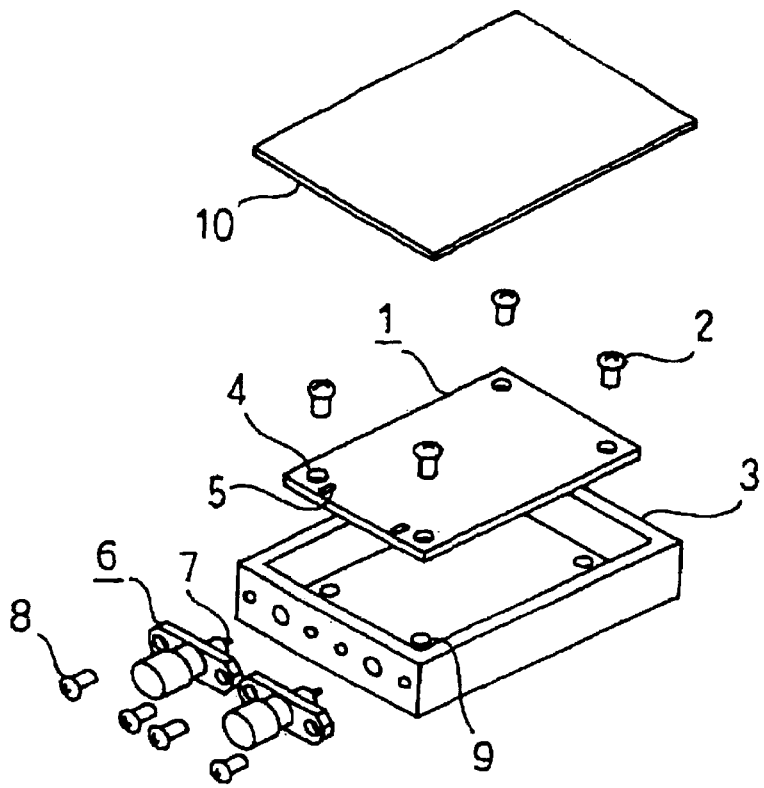
FIG. 5A is a perspective view illustrating a prior art electronic device.
Figure 5B:
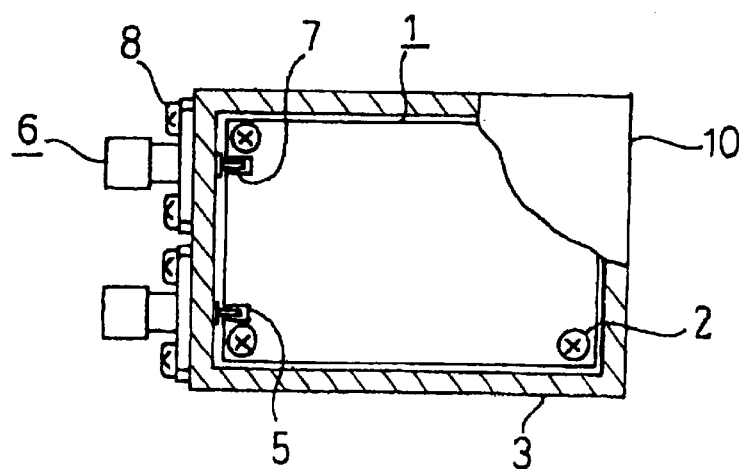
FIG. 5B is an upper view illustrating the prior-art electronic device of FIG. 5A in a mounted state.

FIG. 1 is a perspective view illustrating an electronic device according to a first preferred embodiment of the present invention. Referring FIG. 1, numerals 1 to 10 indicate the same constituent elements as described for the device shown in FIGS. 5(A) and 5(B). Numeral 11 indicates a washer with a small surface friction resistance. The washer 11 is placed on the fixing portion positioned of the circuit board 1, on the confronting side to the coaxial connectors 6. The washer 11 may be either a resin washer using as a material, for example, poly-4-ethylene fluoride or nylon, or a metal washer coated with a fluoroplastic.

Screws 2 acting as fixtures are respectively inserted into holes 4 formed in the circuit board 1 on the side of the coaxial connector 6 (refer to the left side in FIG. 1). Other screws 2 are respectively inserted through washers 11 into holes 4 formed in the circuit board 1 apart from the coaxial connector 6 (refer to the right side in FIG. 1). The circuit board 1 and the case 3 are fastened together by threading the screws 2 into the thread holes 9. With this structure, even when the circuit board 1 and the case 3 thermally expand or contract, the tension caused by differences in expansion or contraction (that is, in linear expansion coefficient) is relaxed because the circuit board 1 slides horizontally between each case 3 and each washer 11. Because no tension acts on the soldering portion between the land 5 and the lead terminal 7 and degradation of the soldering strength can be prevented, while the signal transmission can be maintained over a long period of time without deterioration of the high-frequency characteristics between the circuit board 1 and the coaxial connector 6.

It may be desirable that the screws 2 positioned on the side of the coaxial connector 6 and the screw 2 positioned apart from the coaxial connector 6 are respectively threaded through washers in order to fasten the circuit board 1. In addition to resin washers or fluoroplastic-coated metal washers, conventionally available metal washers with the surface friction resistance satisfying requirements for the invention may be used as the washer 11. It may also be desirable that each washer 11 is disposed on the circuit board 1. However, each washer 11 with a reduced surface friction resistance may be inserted between the circuit board 1 and the case 3.

Figure 2A:
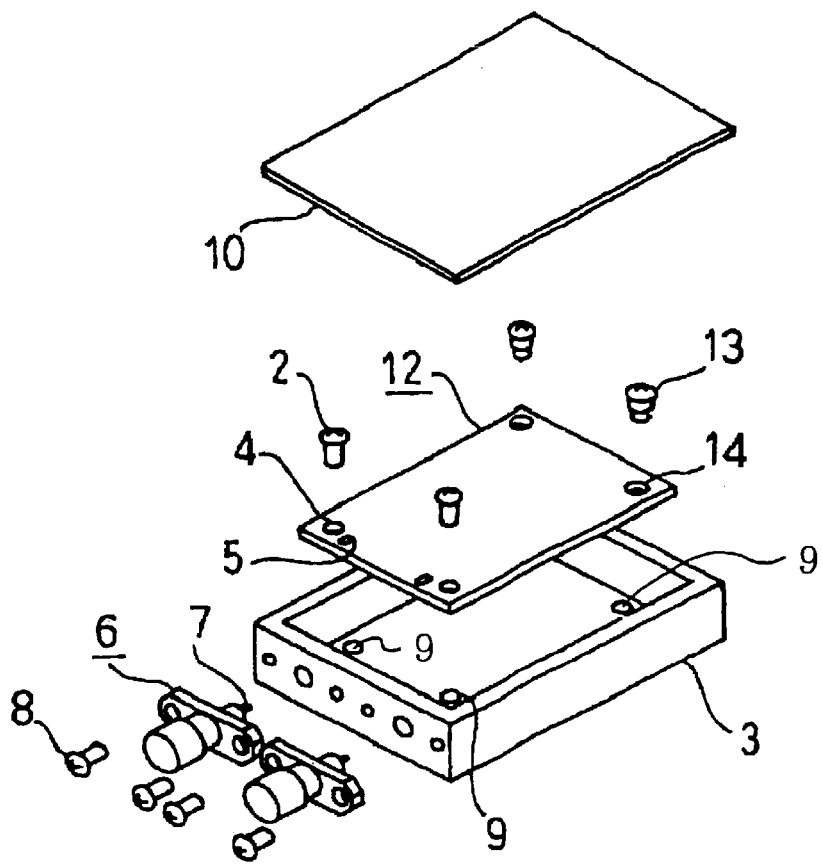
FIG. 2A is a perspective view illustrating an electronic device according to a second embodiment of the present invention.
Figure 2B:
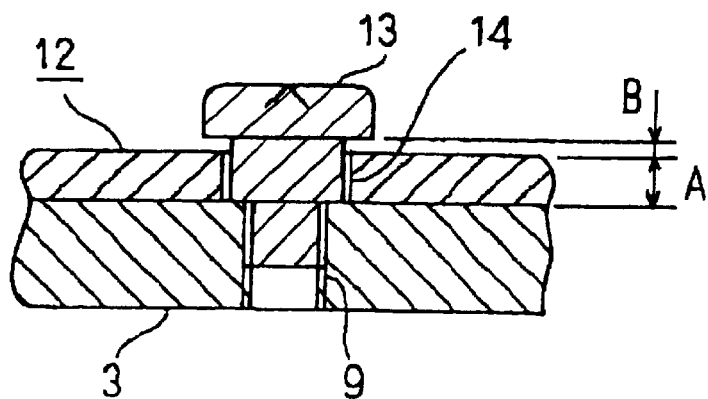
FIG. 2B is a cross-sectional view illustrating the distinctive portion of an electronic device of the second embodiment in a mounted state.

FIG. 2(A) is a perspective view illustrating an electronic device according to a second embodiment of the present invention. FIG. 2(B) is a cross-sectional view illustrating the distinctive portion of FIG. 2(A) in a mounted state. Referring to FIGS. 2(A) and 2(B), numerals 2 to 10 indicate the same constituent elements as those previously described. Numeral 12 indicates a circuit board on which high-frequency circuits are mounted. Numeral 13 is a special screw which is used on the fixing portion of the circuit board 12, on the opposite side of the coaxial connector 6. The stepped shank of the special screw 13 is equal to or slightly greater than the thickness of the circuit board 12. Numeral 14 indicates an insertion hole passing through the circuit board 12 to accept the special screw 13. Referring to FIG. 2(B), the symbol A indicates the thickness of the circuit board 12. The symbol B indicates the gap between the circuit board 12 and the head of the special screw 13. (A+B) is the length of the shank of the special screw 13, where B is set to, for instance, 0 to 0.1 mm.

In this electronic device, screws 2 acting as fixtures are respectively inserted into holes 4 in the circuit board 12 on the side of the coaxial connector 6. Special screws 13 are respectively inserted into holes 14 in the circuit board 12, on the opposite side of the coaxial connector 6. The circuit board 12 and the case 3 are fastened together by threading the screws 2 and 13 into the corresponding threaded holes 9. Even when the circuit board 12 and the case 3 expand or contract thermally, the circuit board 12 can horizontally move between the case 3 and the head of the special screw 13. Hence, the tension caused by differences in expansion or contraction (that is, in linear expansion coefficient) is relaxed. Since the tension does not act the soldering portion between the land 5 and the lead terminal 7, degradation of the soldering strength can be prevented. Hence, the signal transmission can be maintained over a long period of time without deterioration of the high-frequency characteristics of the circuit board 12 and the coaxial connector 6.

Figure 3:
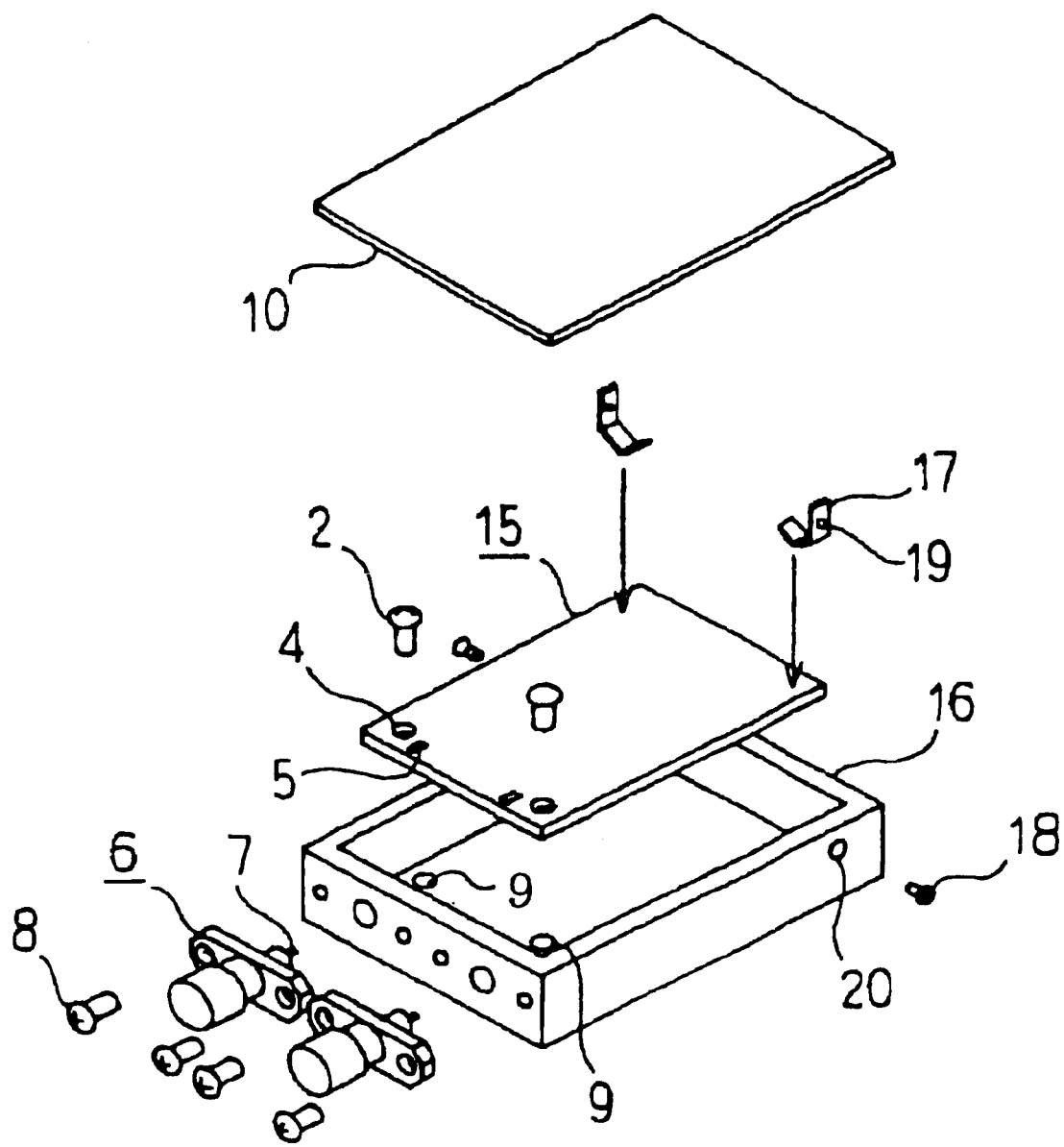
FIG. 3 is a perspective view illustrating an electronic device according to a third embodiment of the present invention.

FIG. 3 is a perspective view illustrating an electronic device according to a third embodiment of the present invention. Referring to FIG. 3, numerals 4 to 10 indicate the same constituent elements as those previously described. Numeral 15 indicates a circuit board on which high-frequency circuits are mounted. Numeral 16 indicates a case holding the circuit board 15. Numeral 17 indicates a thumbnail shaped tool acting as a resilient holding tool which is disposed on the fixing portion of the circuit board 15, apart from the coaxial connector 6, to press down the circuit board 15 in the direction of the thickness thereof. The tool 17 is formed of bent sheet metal. Numeral 18 indicates a screw for fastening the tool 17 to the case 16. Numeral 19 indicates a threaded hole formed in the tool 17. The screw 18 is threaded into the threaded hole 19. Numeral 20 indicates an insertion hole formed in the case 16. The screw 18 is inserted into the insertion hole 20.

In the electronic device, screws 2 act as fixtures and are respectively threaded into threaded holes 9 through holes 4 in the circuit board on the side of the coaxial connector 6. Screws 18 are respectively threaded into threaded holes 19 through holes 20. Thus, each of the tools 17, which is fastened to the other side of the case 16 apart from the coaxial connector 6, biases the circuit board 15 in the thickness direction thereof so that the circuit board 15 is fixed on the case 16. With this structure, even when the circuit board 15 and the case 16 thermally expand or contract, the tension caused by differences in expansion or contraction (that is, in linear expansion coefficient) is relaxed because the circuit board 15 horizontally moves between the case 16 and the tool 17. The tension does not act on the soldering portion between the land 5 and the lead terminal 7 and degradation of the soldering strength can be prevented. Hence, the signal transmission can be maintained over a long period of time without deterioration of the high-frequency characteristics of the circuit board 15 and the coaxial connector 6.

Figure 4:
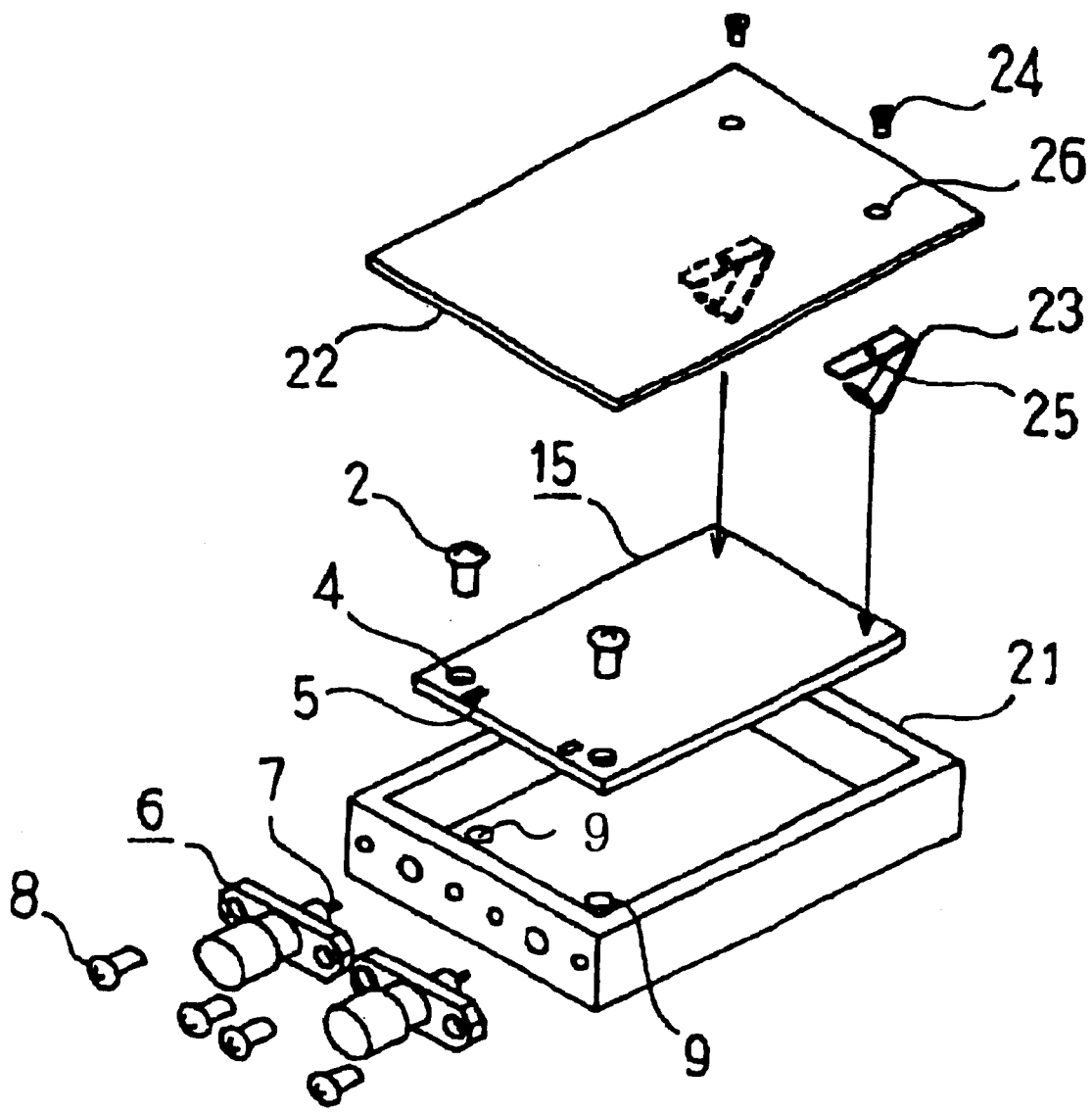
FIG. 4 is a perspective view illustrating an electronic device according to a fourth embodiment of the present invention.

FIG. 4 is a perspective view illustrating an electronic device according to a fourth embodiment of the invention. Referring to FIG. 4, numerals 2 and 4 through 9 indicate the same constituent elements as those previously described while the circuit board 15 corresponds to that in the third embodiment. Numeral 21 indicates a case for holding the circuit board 15. Numeral 22 indicates a cover to be fixed to the case 21. Numeral 23 indicates a thumbnail shaped tool acting as a resilient holding tool attached on the folding portion of the cover 22, apart from the coaxial connector 6, to press down the circuit board 15 in the thickness direction thereof. Numeral 24 indicates a screw for fastening the tool 23 on the cover 2. Numeral 25 indicates a threaded hole formed in the tool 23, into which the screw 24 is threaded. Numeral 26 indicates an insertion hole formed in the upper cover 22 for accepting the screw 24.

In this electronic device, screws 2 act as fixtures and are respectively threaded into threaded holes 9 through holes 4 in the circuit board 15 on the side of the coaxial connector 6. Screws 24 are respectively threaded into the threaded holes 9 through holes 26 and the cover 22 is fastened to the case 21. The tools 23, which are fixed on the cover 22 and apart from the coaxial connector 6, press down the circuit board 15 in the thickness of the circuit board 15. With this structure, even if the circuit board 15 and the case 21 thermally expand or contract, the tension caused by differences in expansion or contraction (that is, in linear expansion coefficient) is relaxed because the circuit board 15 horizontally slides between the case 21 and the tool 23. Therefore, the tension does not act on the soldering portion between the land 5 and the lead terminal 7 so that the soldering strength can be prevented. The high-frequency signal transmission between the circuit board 15 and the coaxial connector 6 can be maintained over a long period of time.

In the third and fourth embodiments as described above, tools or screws acting as additional components are fastened to the case or the cover. Similar effects may be achieved by forming the tool from the case or cover itself through sheet metal working or a combination, of a spring and a pin may be formed as holding member to press the circuit board 15 in the thickness direction thereof.

What is claimed is:
1. An electronic device comprising:
   a circuit board on which high-frequency circuits are mounted, said circuit board having a land;
   a case to which said circuit board is assembled, said case having a linear expansion characteristic different from that of said circuit board;
   a connector connected to said case and electrically connected to an external high-frequency signal, said connector having a lead terminal soldered to said land of said circuit board for transmitting the high-frequency signal to said circuit board;
   a fixture fixing said circuit board to said case on the side of said circuit board and near said connector; and
   a sliding tool mounted on the other side of said circuit board and apart from said connector, and sliding said circuit board in the direction perpendicular to the thickness of said circuit board according to ambient thermal changes, with said circuit board being held in the direction of the thickness thereof.

2. An electronic device comprising:
   a circuit board on which high-frequency circuits are mounted, said circuit board having a land;
   a case to which said circuit board is assembled, said case having a linear expansion characteristic different from that of said circuit board;
   a connector connected to said case and electrically connected to an external high-frequency signal, said connector having a lead terminal soldered to said land of said circuit board for transmitting the high-frequency signal to said circuit board;

a fixture fixing said circuit board to said case on the side of said circuit board and near said connector;

a screw fastening said circuit board to said case on the other side of said circuit board and apart from said connector; and a washer inserted between the head of said screw and said circuit board and having a small surface frictional resistance.

3. The electronic device according to claim 2, wherein said washer is formed of a resin of poly-4-ethylene fluoride and nylon, or of a metal coated with a resin.

* * * * *